US009705451B2

(12) United States Patent
Takenaka et al.

(10) Patent No.: US 9,705,451 B2
(45) Date of Patent: Jul. 11, 2017

(54) POWER AMPLIFICATION MODULE

(71) Applicant: Murata Manufacturing Co., Ltd., Kyoto (JP)

(72) Inventors: Kiichiro Takenaka, Kyoto (JP); Tsuyoshi Sato, Kyoto (JP); Masahiro Ito, Kyoto (JP); Hidetoshi Matsumoto, Kyoto (JP); Satoshi Tanaka, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 14/932,275

(22) Filed: Nov. 4, 2015

(65) Prior Publication Data
US 2016/0056769 A1 Feb. 25, 2016

Related U.S. Application Data

(63) Continuation of application No. PCT/JP2014/063053, filed on May 16, 2014.

(30) Foreign Application Priority Data

Jul. 4, 2013 (JP) .................................. 2013-140841

(51) Int. Cl.
H03F 3/45 (2006.01)
H03F 1/02 (2006.01)
(Continued)

(52) U.S. Cl.
CPC ......... *H03F 1/0205* (2013.01); *H03F 1/0211* (2013.01); *H03F 1/0222* (2013.01);
(Continued)

(58) Field of Classification Search
CPC ....................................... H03F 3/45

USPC ........................................ 330/252, 276, 165
See application file for complete search history.

(56) References Cited

U.S. PATENT DOCUMENTS 7,119,615 B2 * 10/2006 Ten Dolle ........... H03F 3/45089
330/252
8,629,727 B2 * 1/2014 Sutardja ................. H03F 1/223
330/252
(Continued)

FOREIGN PATENT DOCUMENTS

CN 1647368 A 7/2005
CN 102983821 A 3/2013
(Continued)

OTHER PUBLICATIONS

International Search Report issued in Application No. PCT/JP2014/063053 dated Jul. 15, 2014.
(Continued)

*Primary Examiner* — Henry Choe
(74) *Attorney, Agent, or Firm* — Pearne & Gordon, LLP

(57) ABSTRACT

An envelope tracking system is employed in a power amplification module that supports multiple frequency bands. The power amplification module includes multiple power amplification circuits, each of which includes: a first transformer to which a radio frequency signal is input; a differential amplification circuit, in which a first radio frequency signal output from transformer is input to a control electrode and in which a second radio frequency signal output from the transformer is input to a control electrode, the differential amplification circuit outputting an amplified signal obtained by amplifying a difference between the first and second radio frequency signals; and a second transformer for supplying, to the first differential amplification circuit, power-supply voltage varying according to the amplitude of the radio frequency signal and to which the first amplified signal is input.

17 Claims, 14 Drawing Sheets

(51) Int. Cl.
*H03F 3/191* (2006.01)
*H03F 3/21* (2006.01)
*H03F 3/24* (2006.01)
*H03F 3/193* (2006.01)

(52) U.S. Cl.
CPC ............ *H03F 3/191* (2013.01); *H03F 3/193* (2013.01); *H03F 3/211* (2013.01); *H03F 3/245* (2013.01); *H03F 3/45085* (2013.01); *H03F 3/45179* (2013.01); *H03F 2200/336* (2013.01); *H03F 2200/451* (2013.01); *H03F 2200/534* (2013.01); *H03F 2200/541* (2013.01); *H03F 2200/555* (2013.01); *H03F 2200/78* (2013.01); *H03F 2203/21106* (2013.01); *H03F 2203/45481* (2013.01); *H03F 2203/45554* (2013.01); *H03F 2203/45638* (2013.01)

(56) References Cited

U.S. PATENT DOCUMENTS

| 8,860,507 | B2* | 10/2014 | Chen | H03F 3/45 330/252 |
|---|---|---|---|---|
| 2005/0140440 | A1 | 6/2005 | Ten Dolle | |
| 2010/0052784 | A1* | 3/2010 | Yamaguchi | H03F 1/22 330/252 |
| 2012/0112835 | A1* | 5/2012 | Comeau | H03F 1/22 330/252 |
| 2012/0146731 | A1 | 6/2012 | Khesbak | |
| 2013/0057343 | A1 | 3/2013 | Kondo | |

FOREIGN PATENT DOCUMENTS

| JP | H01-105605 A | 4/1989 |
| JP | H08-78980 A | 3/1996 |
| JP | 2005-523632 A | 8/2005 |
| JP | 2008-211671 A | 9/2008 |
| JP | 2012-004821 A | 1/2012 |
| JP | 2013-055578 A | 3/2013 |
| WO | 2012/082787 A1 | 6/2012 |

OTHER PUBLICATIONS

Translation of Written Opinion issued in Application No. PCT/JP2014/063053 dated Jul. 15, 2014.

* cited by examiner (DUMMY TRANSISTOR: NONE)

(DUMMY TRANSISTOR: 1/2 SIZE)

(DUMMY TRANSISTOR: 3/4 SIZE)

(DUMMY TRANSISTOR: FULL-SIZE)

(DUMMY TRANSISTOR: FULL-SIZE: MIM ADDED)

POWER AMPLIFICATION MODULE

BACKGROUND

Technical Field

The present disclosure relates to a power amplification module.

Background Art

A mobile communication device such as a cellular phone employs a power amplification circuit (power amplifier circuit) to amplify power of a signal to be transmitted to a base station. Recently, a modulation system, such as High Speed Uplink Packet Access (HSUPA), Long Term Evolution (LTE), or LTE-Advanced, as a high-speed data communication standard has been employed in a cellular phone. In such a communication standard, it is important to reduce shifts in phase and amplitude in order to improve the communication speed. In other words, the power amplification circuit is required to have high linearity. Further, in such a communication standard, the range of change in the amplitude of a signal (dynamic range) is often increased in order to improve the communication speed. Then, in order to increase linearity even when the dynamic range is large, high power-supply voltage is required, and this tends to increase the power consumption of the power amplification circuit.

In the meantime, the cellular phone is required to reduce power consumption in order to lengthen the time during which a call or communication is enabled. For example, Patent Document 1 discloses an envelope tracking system for controlling the power-supply voltage of a power amplification circuit according to the amplitude level of an input modulated signal in order to improve power efficiency.

CITATION LIST

Patent Document

Patent Document 1: JP2012-4821 A

BRIEF SUMMARY

Recently, it has been support for multiple frequency bands in one power amplification module has been desired. Such a power amplification module is configured to include multiple power amplification circuits corresponding to different frequency bands, respectively. When an envelope tracking system is employed in such a power amplification module that supports multiple frequency bands, a configuration is considered, in which a power supply circuit for performing envelope tracking control is connected to multiple power amplification circuits.

Here, a configuration for providing a decoupling capacitor on a power-supply line to each power amplification circuit to suppress the influence of a high-frequency signal on a power supply is common. In the case of such a configuration, it is common to connect multiple decoupling capacitors to a power supply circuit in a power amplification module that supports multiple frequency bands. Since the multiple decoupling capacitors connected to the power supply circuit repeat charge and discharge, the control of power-supply voltage by envelope tracking becomes sluggish. This leads to reducing the effect of improved power efficiency by employing the envelope tracking system.

The present disclosure has been made in view of such circumstances, and it is an object thereof to improve power efficiency when an envelope tracking system is employed in a power amplification module that supports multiple frequency bands.

A power amplification module according to one aspect of the present disclosure includes multiple power amplification circuits, each of which includes: a first transformer including a first input-side winding wire to which a radio frequency signal is input, and a first output-side winding wire electromagnetically coupled to the first input-side winding wire; a first differential amplification circuit including a first transistor, in which a first radio frequency signal output from a first end of the first output-side winding wire is input to a control electrode of the first transistor, and a second transistor, in which a second radio frequency signal output from a second end of the first output-side winding wire is input to a control electrode of the second transistor, the first differential amplification circuit outputting a first amplified signal obtained by amplifying a difference between the first and second radio frequency signals; and a second transformer including a second input-side winding wire, to which the first amplified signal is input, for supplying a power-supply voltage that varies according to an amplitude of the radio frequency signal to the first differential amplification circuit, and a second output-side winding wire electromagnetically coupled to the second input-side winding wire.

According to the present disclosure, power efficiency when an envelope tracking system is employed in a power amplification module that supports multiple frequency bands can be improved.

DETAILED DESCRIPTION

Figure 1:
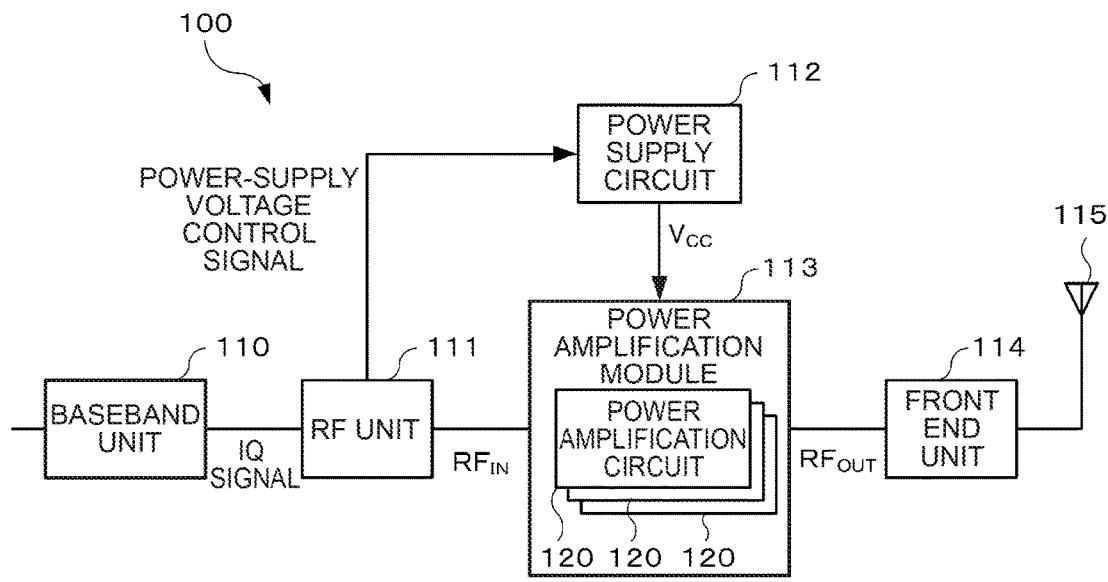
FIG. 1 is a diagram illustrating a configuration example of a transmitting unit including a power amplification module as one embodiment of the present disclosure.

One embodiment of the present disclosure will be described below with reference to the drawings. FIG. 1 is a diagram illustrating a configuration example of a transmitting unit including a power amplification module as one embodiment of the present disclosure. For example, a transmitting unit 100 is used in a mobile communication device such as a cellular phone to transmit various signals such as voice and data to a base station. The transmitting unit 100 of the embodiment supports multiple frequency bands for radio frequency (RF) signals. Although the mobile communication device also includes a receiving unit for receiving signals from the base station, the description thereof will be omitted here.

As illustrated in FIG. 1, the transmitting unit 100 is configured to include a baseband unit 110, an RF unit 111, a power supply circuit 112, a power amplification module 113, a front end unit 114, and an antenna 115.

The baseband unit 110 modulates an input signal such as voice or data based on a modulation system such as HSUPA or LTE, and outputs the modulated signal. In the embodiment, the modulated signal output from the baseband unit 1100 is output as an IQ signal (I signal and Q signal) representing the amplitude and phase on an I-Q plane. For example, the frequency of the IQ signal ranges from about several MHz to several tens of MHz.

The RF unit 111 generates an RF signal from the IQ signal output from the baseband unit 110 to perform radio transmission. For example, the RF signal ranges from about hundreds of MHz to several GHz. Further, the RF unit 111 detects the amplitude level of the modulated signal based on the IQ signal, and outputs a power-supply voltage control signal to the power supply circuit 112 so that power-supply voltage $V_{CC}$ supplied to the power amplification module 113 will be a level corresponding to the amplitude level of the RF signal. In other words, the RF unit 111 outputs a power-supply voltage control signal to perform envelope tracking.

Note that the IQ signal may be converted to an intermediate frequency (IF) signal to generate the RF signal from the IF signal in the RF unit 111, rather than direct conversion from the IQ signal to the RF signal.

The power supply circuit 112 generates power-supply voltage $V_{CC}$ of a level corresponding to the power-supply voltage control signal output from the RF unit 111, and supplies it to the power amplification module 113. For example, the power supply circuit 112 can include a DC-DC converter for generating power-supply voltage $V_{CC}$ of the level corresponding to the power-supply voltage control signal.

Figure 2:
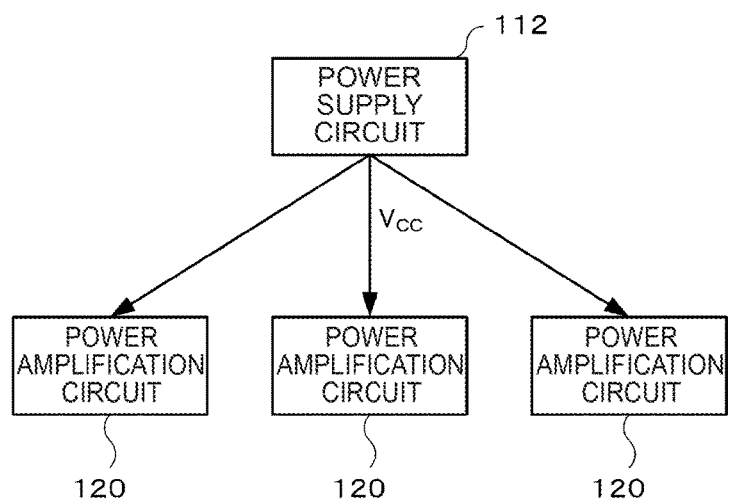
FIG. 2 is a diagram illustrating an example of a configuration in which multiple power amplification circuits are star-connected to a power supply circuit.

The power amplification module 113 amplifies the power of the RF signal ($RF_{IN}$) output from the RF unit 111 to a level necessary for transmission to a base station, and outputs the amplified signal ($RF_{OUT}$). The power amplification module 113 includes multiple power amplification circuits 120 different in frequency band to be processed. As illustrated in FIG. 2, the multiple power amplification circuits 120 are directly connected to the power supply circuit 112 in the form of a star connection. The term "star connection" here means a shape in which the multiple power amplification circuits 120 are connected radially around the power supply circuit 112. Although three power amplification circuits 120 are illustrated in the power amplification module 113 in FIG. 1 and FIG. 2, the number and geometry of power amplification circuits 120 is not limited thereto, and it may be two, or four or more.

Figure 3:
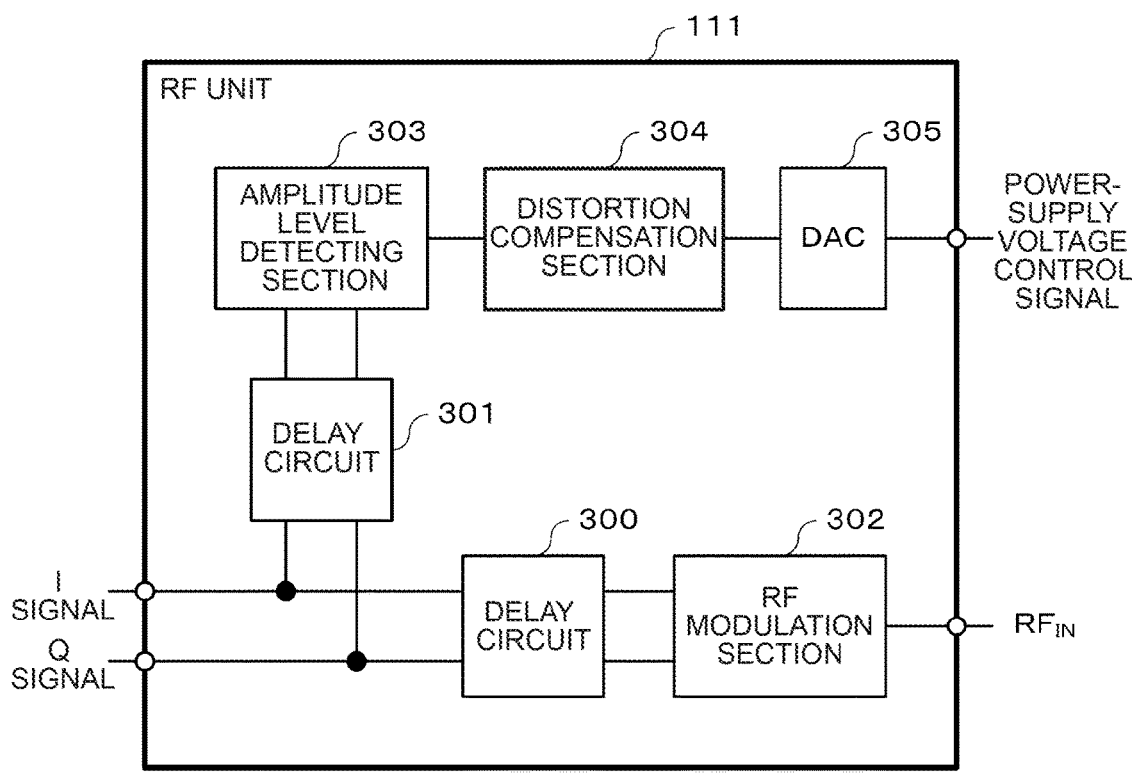
FIG. 3 is a diagram illustrating an example of the configuration of an RF unit.

FIG. 3 is a diagram illustrating an example of the configuration of the RF unit 111. As illustrated in FIG. 3, the RF unit 111 is configured to include delay circuits 300, 301, an RF modulation section 302, an amplitude level detecting section 303, a distortion compensation section 304, and a digital-to-analog converter (DAC) 305.

The delay circuits 300, 301 are circuits for delaying the IQ signal for a predetermined length of time to match the timing, at which the RF signal is input to each power amplification circuit 120, with the timing at which power-supply voltage $V_{CC}$ corresponding to the amplitude level of the RF signal is supplied to the power amplification circuit 120.

The RF modulation section 302 generates the RF signal from the IQ signal and outputs the RF signal. Specifically, for example, the RF modulation section 302 synthesizes the I signal and a carrier signal at multiplier, synthesizes, at the multiplier, the Q signal and a carrier signal 90 degrees out of phase with the carrier signal, and synthesizes these synthesized signals at a subtracter so that the RF signal can be obtained.

The amplitude level detecting section 303 detects the amplitude level of the modulated signal based on the IQ signal. The amplitude level detected here corresponds to the amplitude level of the RF signal output from the RF modulation section 302.

The distortion compensation section 304 adjusts the level of the power-supply voltage $V_{CC}$ not to cause an amplitude distortion in the amplified signal upon envelope tracking. The gain characteristics of transistors used in the power amplification circuit 120 can change according to the power-supply voltage $V_{CC}$. Therefore, it is necessary to control the power-supply voltage $V_{CC}$ to make the gain constant in order to maintain linearity in the power amplification circuit 120. For example, the distortion compensation section 304 can store a table indicating a correspondence relation between the amplitude level of the modulated signal and the level of the power-supply voltage $V_{CC}$ based on the gain characteristics of the transistors. Then, based on this table, the distortion compensation section 304 can output the power-supply voltage control signal as a digital signal to set the power-supply voltage $V_{CC}$ to a level corresponding to the amplitude level of the modulated signal.

The DAC 305 converts the power-supply voltage control signal as the digital signal output from the distortion compensation section 304 into a power-supply voltage control signal as an analog signal, and outputs the power-supply voltage control signal.

Figure 4:
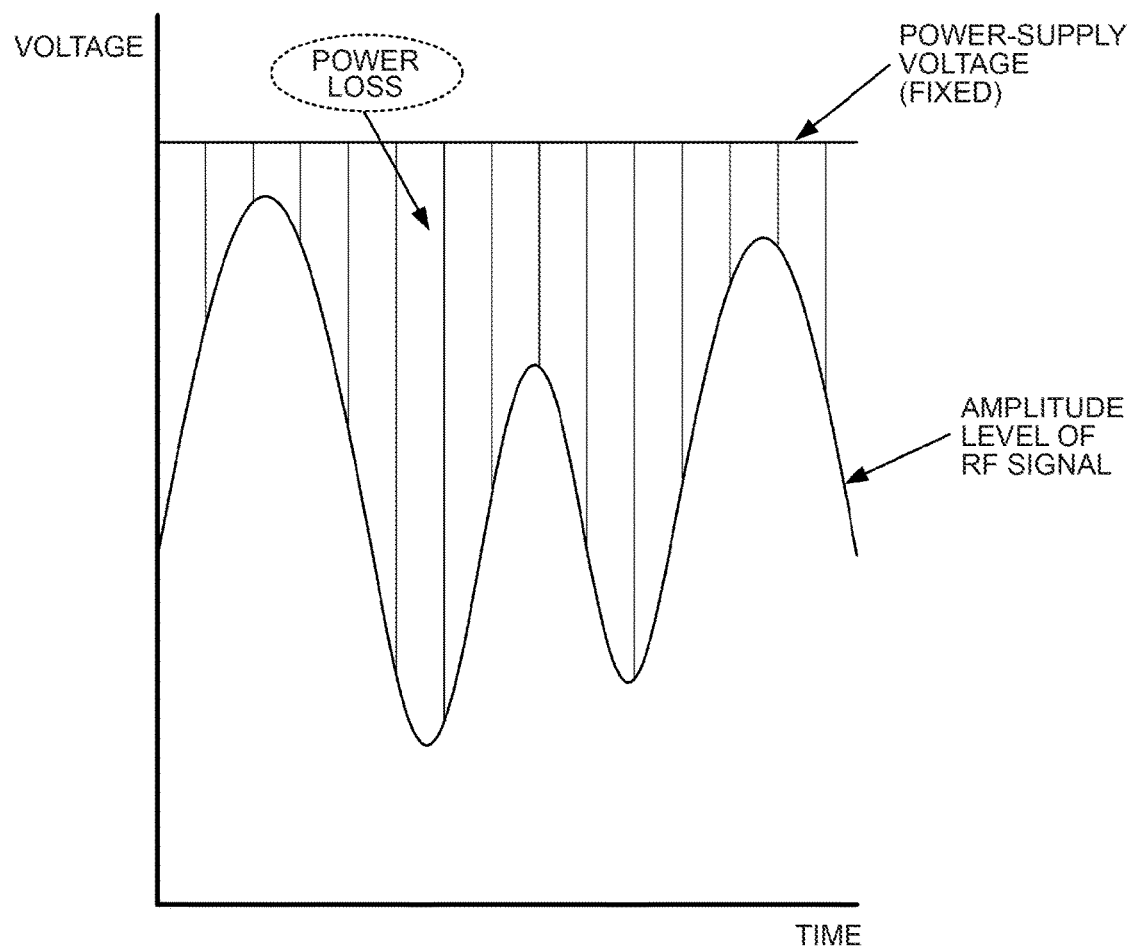
FIG. 4 is a graph illustrating an example of power loss when power amplification is performed using fixed power-supply voltage.
Figure 5:
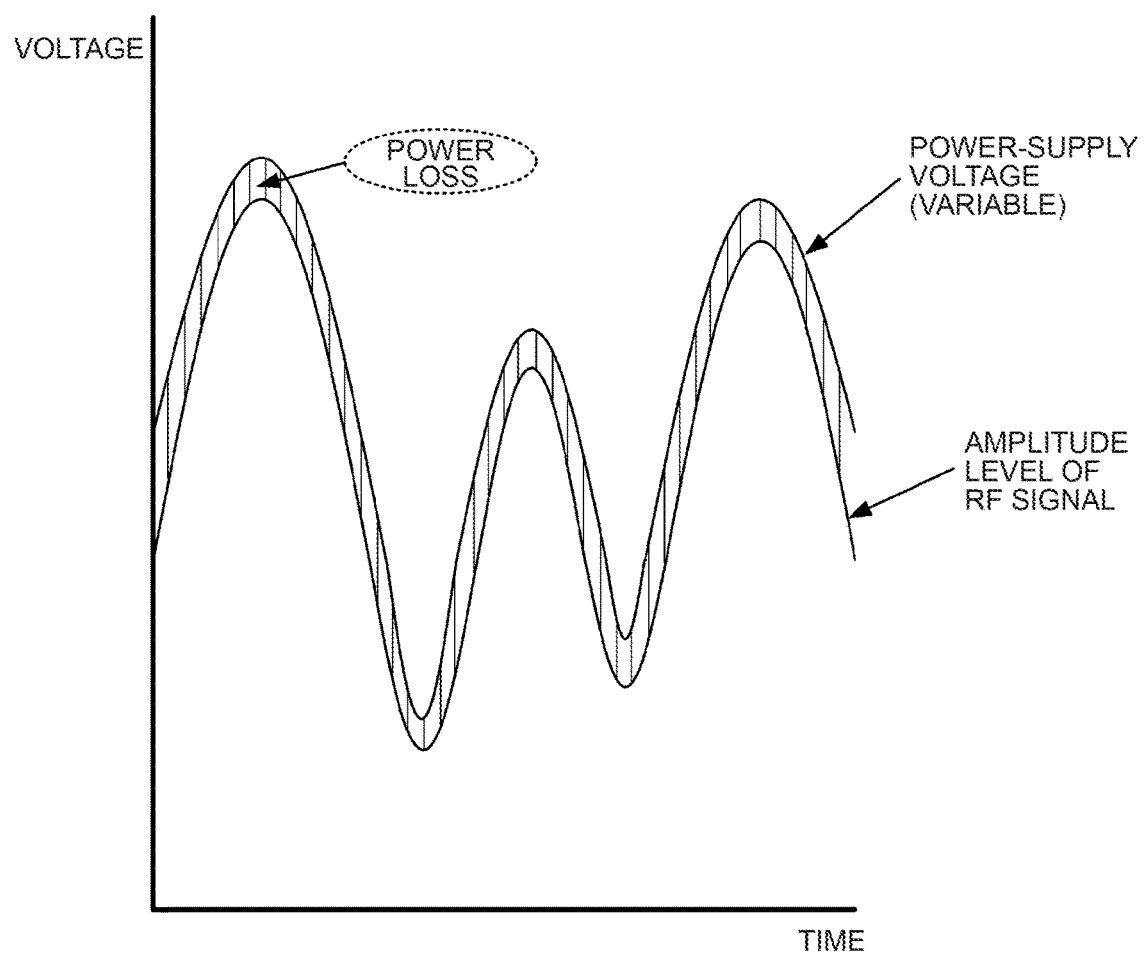
FIG. 5 is a graph illustrating an example of power loss when power amplification is performed using variable power-supply voltage by envelope tracking.

Referring to FIG. 4 and FIG. 5, an example of power-supply voltage control by envelope tracking will be described. FIG. 4 illustrates an example of power loss when power amplification is performed using fixed power-supply voltage. As illustrated in FIG. 4, when the amplitude level of the RF signal changes significantly, if fixed power-supply voltage adjusted to the maximum amplitude level of the RF signal is employed, power loss will increase in a section where the amplitude level of the RF signal is low.

FIG. 5 illustrates an example of power loss when power amplification is performed using variable power-supply voltage by envelope tracking. As illustrated in FIG. 5, power loss can be reduced by varying the power-supply voltage according to the amplitude level of the RF signal.

In the embodiment, based on the power-supply voltage control signal output from the RF unit 111, the power supply circuit 112 controls the power-supply voltage $V_{CC}$ supplied to the power amplification circuit 120 to the level corresponding to the amplitude level of the RF signal.

Figure 6:
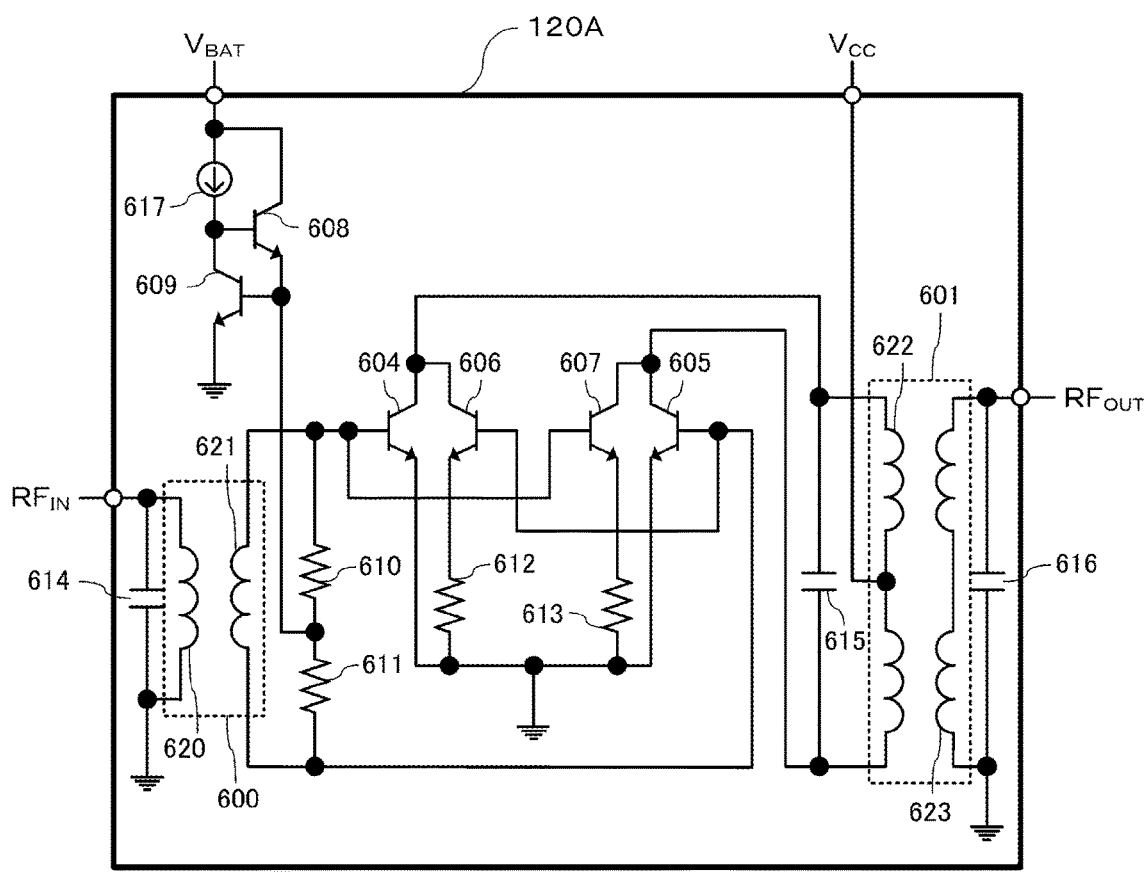
FIG. 6 is a diagram illustrating an example of the configuration of a power amplification circuit.

FIG. 6 is a diagram illustrating an example (power amplification circuit 120A) of the configuration of a power amplification circuit 120. As illustrated in FIG. 6, the power amplification circuit 120A can include transformers 600, 601, NPN transistors 604 to 609, resistors 610 to 613, capacitors 614 to 616, and a constant current circuit 617. The transistors (NPN transistors 604 to 609) that constitute the power amplification circuit 120A can be, for example, heterojunction bipolar transistors (HBTs). As will be described later, the transistors that constitute the power amplification circuit 120A are not limited to the HBTs. For example, MOSFETs (Metal-Oxide-Semiconductor Field-Effect Transistors) can also be used.

The transformer 600 (first transformer) includes an input-side (primary-side) winding wire 620 (first input-side winding wire) and an output-side (secondary-side) winding wire 621 (first output-side winding wire) electromagnetically coupled to the input-side winding wire 620. The transformer 600 outputs, from both ends of the output-side winding wire 621, RF signals corresponding to the RF signal ($RF_{IN}$) input to the input-side winding wire 620. Note that an RF signal (first radio frequency signal) input to the base of the NPN transistor 604 and an RF signal (second radio frequency signal) input to the base of the NPN transistor 605 are opposite in phase to each other.

The transformer 601 (second transformer) includes an input-side (primary-side) winding wire 622 (second input-side winding wire) and an output-side (secondary-side) winding wire 623 (second output-side winding wire) electromagnetically coupled to the input-side winding wire 622. The power-supply voltage $V_{CC}$ is applied to a midpoint of the input-side winding wire 622 of the transformer 601, and amplified signals (differentially-amplified signals) generated by the NPN transistors 604, 605 are input to both ends thereof. The transformer 601 outputs, from the output-side winding wire 623, an amplified signal corresponding to the amplified signals input to the input-side winding wire 622.

The NPN transistor 604 (first transistor) and the NPN transistor 605 (second transistor) constitute a differential amplification circuit (first differential amplification circuit). The power-supply voltage $V_{CC}$ is supplied to the collectors (input electrodes) of the NPN transistors 604, 605 through the input-side winding wire 622 of the transformer 601. The emitters (output electrodes) of the NPN transistors 604, 605 are grounded. Then, the base (control electrode) of the NPN transistor 604 is connected to one end of the output-side winding wire 621 of the transformer 600, and the base of the NPN transistor 605 is connected to the other end of the output-side winding wire 621 of the transformer 600. Since the RF signals input to the bases of the NPN transistors 604, 605 are opposite in phase to each other, a signal output from the collectors of the NPN transistors 604, 605 is an amplified signal (first amplified signal) obtained by amplifying a difference between the RF signals input to the bases of the NPN transistor 604, 605. In other words, the signal output from the collectors of the NPN transistor 604, 605 is the amplified signal of the RF signal.

The NPN transistor 606 (third transistor) and the NPN transistor 607 (fourth transistor) are cross-coupled to the NPN transistor 604 and the NPN transistor 605. Specifically, the collector of the NPN transistor 606 is connected to the collector of the NPN transistor 604, and the emitter thereof is grounded through the resistor 612. Then, the base of the NPN transistor 606 is connected to the base of the NPN transistor 605. The collector of the NPN transistor 607 is connected to the collector of the NPN transistor 605, and the emitter thereof is grounded through the resistor 613. Then, the base of the NPN transistor 607 is connected to the base of the NPN transistor 604.

Note that the resistance value of the resistors 612, 613 is relatively large, e.g., about several kiloohms, so that current flowing through the NPN transistors 606, 607 will be low.

The NPN transistors 606, 607 are dummy transistors provided to suppress the gain of the power amplification circuit 120A from varying according to the power-supply voltage $V_{CC}$. The base-collector capacitances (parasitic capacitances) of the NPN transistors 604, 605 vary according to the base-collector voltage. Therefore, the gain of the differential amplification circuit made up of the NPN transistors 604, 605 varies according to the power-supply voltage $V_{CC}$. In the embodiment, however, since the NPN transistors 606, 607 are cross-coupled to the NPN transistors 604, 605, the RF signal input to the NPN transistors 606, 607 and the RF signal input to the NPN transistors 604, 605 are opposite in phase to each other due to the base-collector capacitances of the NPN transistors 606, 607. Thus, since the change in base-collector capacitance of the NPN transistors 604, 605 and the change in base-collector capacitance of the NPN transistors 606, 607 become opposite in direction to each other, the base-collector capacitances of the NPN transistor 604, 605 are canceled out. This can lead to suppression of a gain variation in the power amplification circuit 120A.

The NPN transistors 608, 609, the constant current circuit 617, and the resistors 610, 611 constitute a bias circuit using battery voltage $V_{BAT}$ to supply bias voltage to the differential amplification circuit made up of the NPN transistors 604, 605.

The capacitors 614 to 616 are provided to match input and output impedance.

In the power amplification circuit 120A thus configured, the RF signal ($RF_{IN}$) input through the transformer 600 is amplified by the differential amplification circuit made up of the NPN transistors 604, 605, and output as the amplified signal ($RF_{OUT}$) through the transformer 601. Then, in the power amplification circuit 120A, the power-supply voltage $V_{CC}$ applied to a midpoint of the primary-side winding wire 622 of the transformer 601 is supplied to the NPN transistors 604, 605 that constitute the differential amplification circuit, respectively. Since this midpoint is a virtual ground point, there is no need to provide a decoupling capacitor on the supply line of the power-supply voltage $V_{CC}$ in the power amplification circuit 120A. Therefore, even when the power-supply voltage $V_{CC}$ controlled by envelope tracking is supplied to multiple power amplification circuits 120A, the control of the power-supply voltage $V_{CC}$ can be suppressed from becoming sluggish. This can improve the accuracy of envelope tracking control, and hence the power efficiency of the power amplification module 113.

Further, in the power amplification circuit 120A, the NPN transistors 606, 607 are cross-coupled to the NPN transistors 604, 605 that constitute the differential amplification circuit. Here, the RF signal input to the base of the NPN transistor 604 and the RF signal input to the base of the NPN transistor 606 are opposite in phase to each other. Therefore, the base-collector capacitance of the NPN transistor 604 is canceled out by the base-collector capacitance of the NPN transistor 606. Similarly, the base-collector capacitance of the NPN transistor 605 is canceled out by the base-collector capacitance of the NPN transistor 607. This can suppress a gain variation in the power amplification circuit 120A.

Although the dummy transistors (NPN transistors 606, 607) for canceling out base-collector capacitances are provided in the configuration illustrated in FIG. 6, the configuration may also be a configuration without such dummy transistors.

FIG. 7A to FIG. 7D are graphs illustrating simulation results where the suppressive effects of adding the NPN transistors 606, 607 on gain variations were confirmed. In FIG. 7A to FIG. 7D, the abscissa indicates the output power (dBm) of the power amplification circuit 120A and the ordinate indicates the gain of the power amplification circuit 120A. FIG. 7A to FIG. 7D illustrate a relationship between output power and gain in a range of the power-supply voltage $V_{CC}$ from 0.5 V to 4.5 V. In the embodiment, the size of a transistor means the number of fingers. Further, the sizes of the NPN transistors 604, 605 in simulation are both 24 fingers.

Figure 7A:
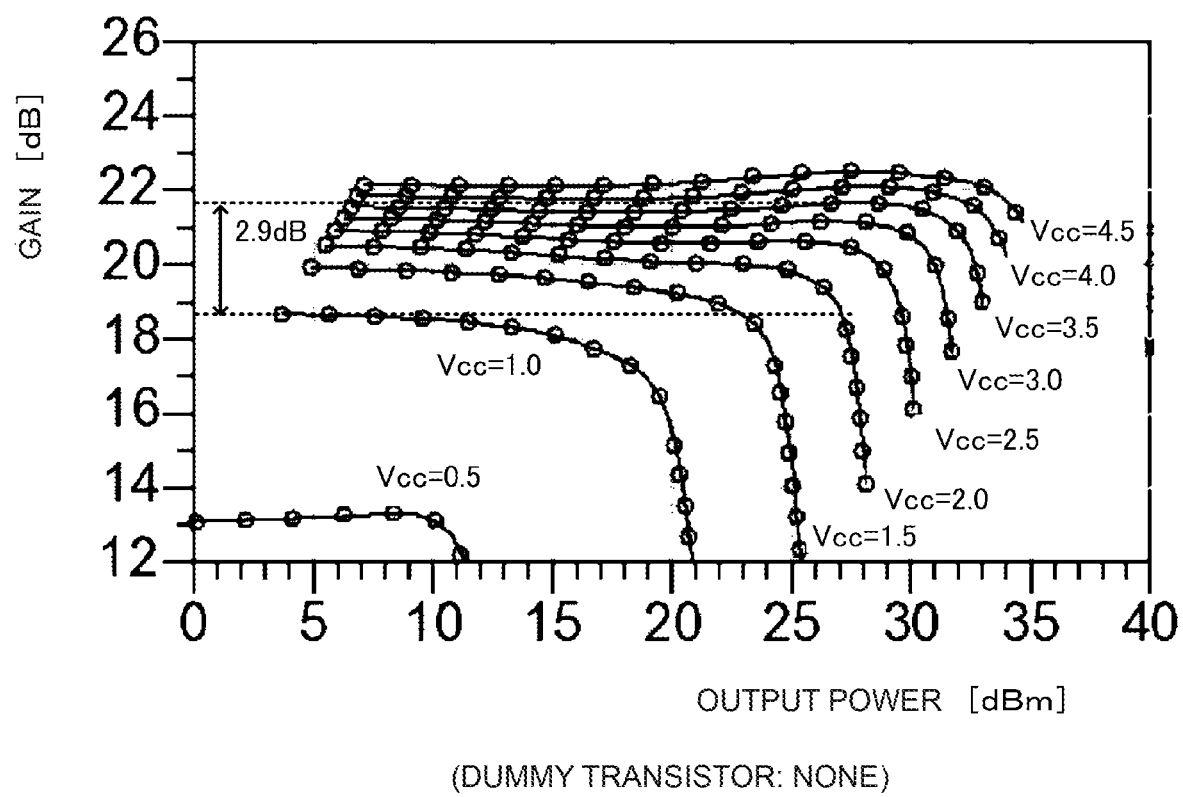
FIG. 7A is a graph illustrating simulation results when there are no dummy transistors.

The graph in FIG. 7A illustrates simulation results when there are no NPN transistors 606, 607 (dummy transistors). In this case, the gain difference in a range of the power-supply voltage $V_{CC}$ from 1.0 V to 3.5 V is about 2.9 dB.

Figure 7B:
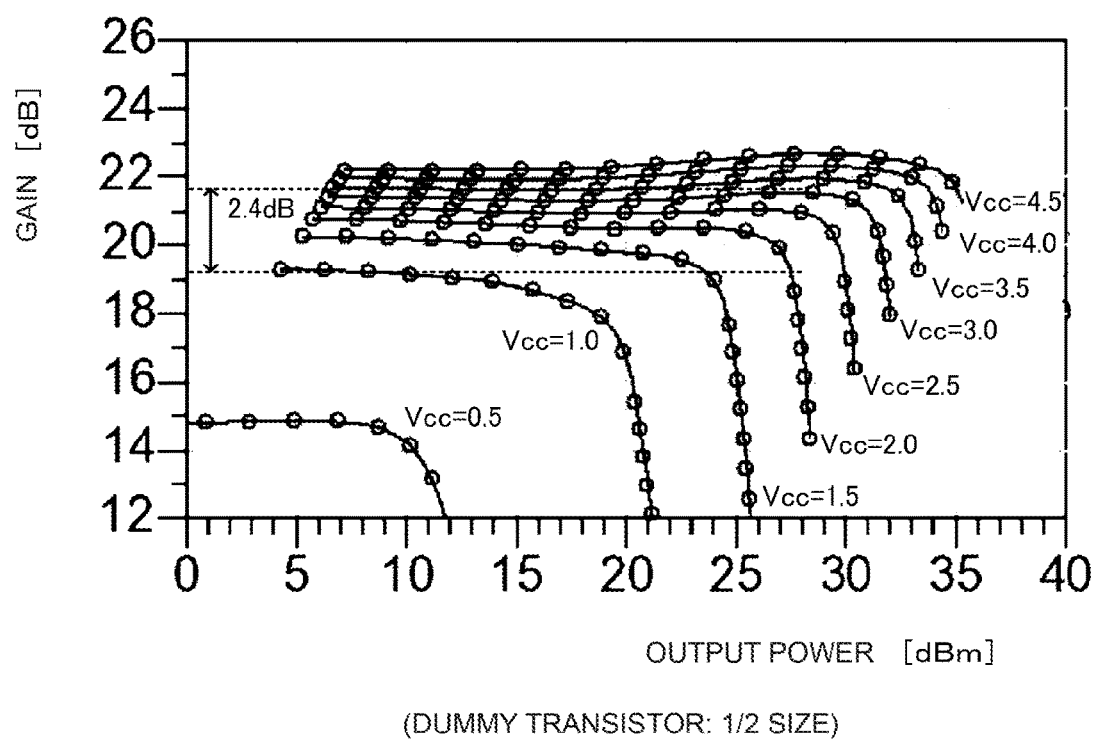
FIG. 7B is a graph illustrating simulation results when the size of dummy transistors is set to ½ of the size of transistors that constitute a differential amplification circuit.

The graph in FIG. 7B illustrates simulation results when the size of the NPN transistors 606, 607 (dummy transistors) is set to ½ (12 fingers) of the size of the NPN transistors 604, 605. In this case, the gain difference in the range of the power-supply voltage $V_{CC}$ from 1.0 V to 3.5 V is about 2.4 dB.

Figure 7C:
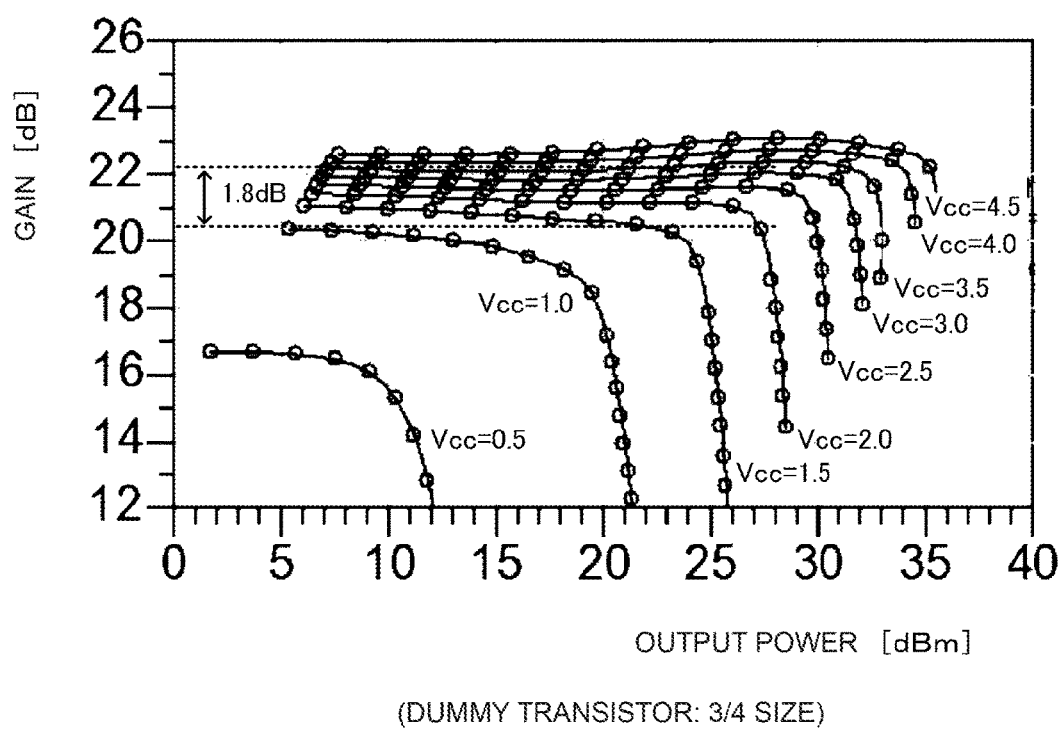
FIG. 7C is a graph illustrating simulation results when the size of the dummy transistors is set to ¾ of the size of the transistors that constitute the differential amplification circuit.

The graph in FIG. 7C illustrates simulation results when the size of the NPN transistors 606, 607 (dummy transistors) is set to ¾ (18 fingers) of the size of the NPN transistors 604, 605. In this case, the gain difference in the range of the power-supply voltage $V_{CC}$ from 1.0 V to 3.5 V is about 1.8 dB.

Figure 7D:
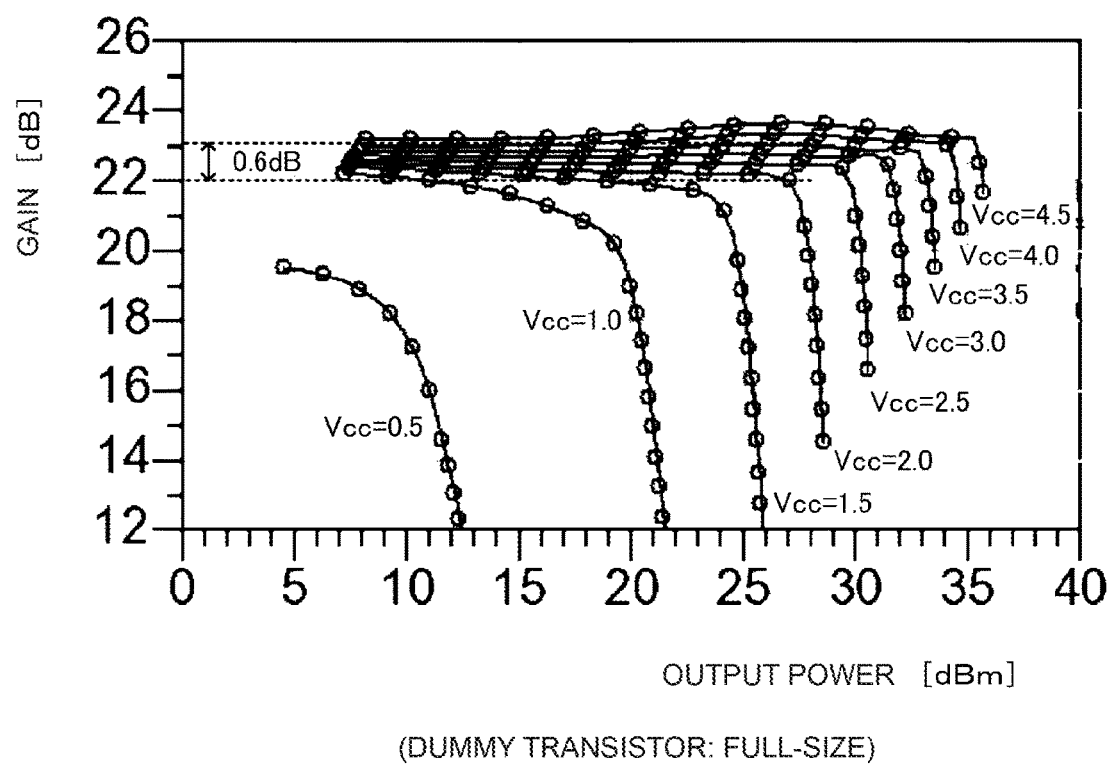
FIG. 7D is a graph illustrating simulation results when the size of the dummy transistors is set identical to the size of the transistors that constitute the differential amplification circuit.

The graph in FIG. 7D illustrates simulation results when the size of the NPN transistors 606, 607 (dummy transistors) is set identical (full-size: 24 fingers) to the size of the NPN transistors 604, 605. In this case, the gain difference in the range of the power-supply voltage $V_{CC}$ from 1.0 V to 3.5 V is about 0.6 dB.

From the simulation results in FIG. 7A to FIG. 7D, it is found that the addition of the NPN transistors 606, 607 leads to suppression of gain variations in the power amplification circuit 120A. Particularly, from the simulation results when the size of the NPN transistors 606, 607 is set identical to the size of the NPN transistors 604, 605 (FIG. 7D), it is found that the suppressive effect on gain variations in the power amplification circuit 120A is high.

Figure 8:
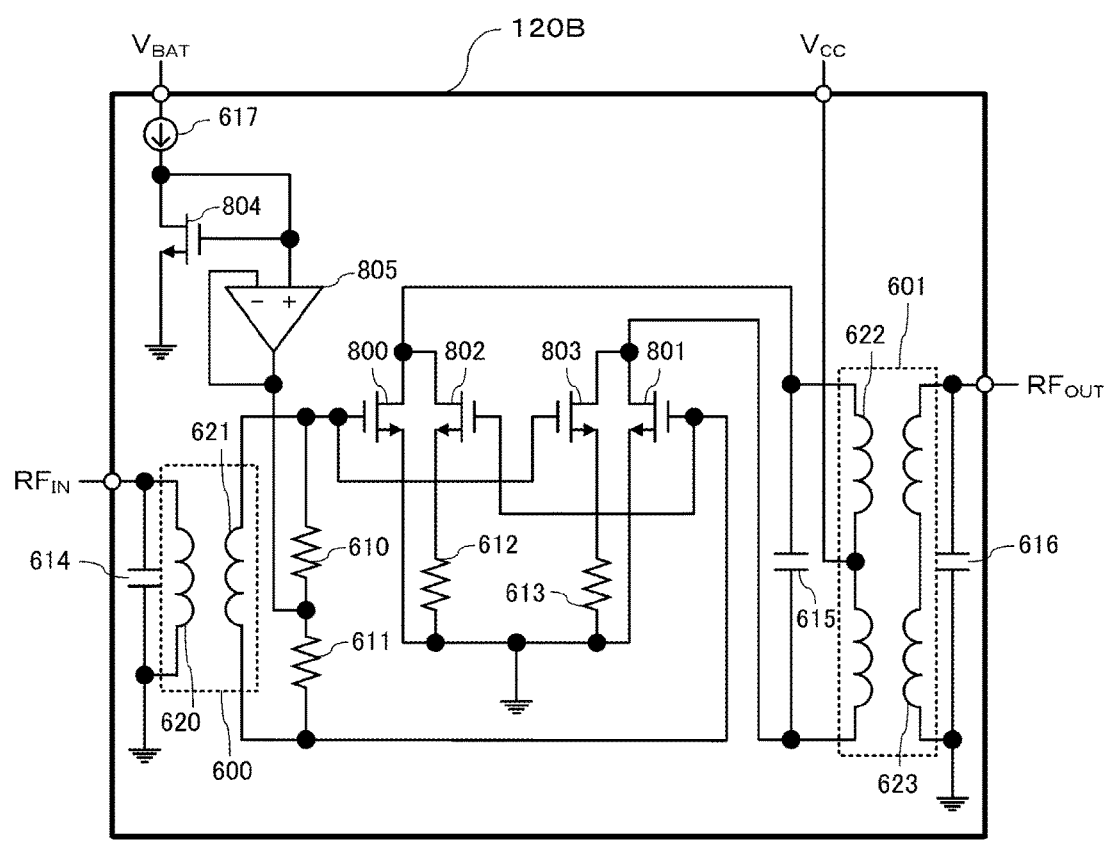
FIG. 8 is a diagram illustrating an example of the configuration of a power amplification circuit using MOSFETs.

FIG. 8 is a diagram illustrating an example (power amplification circuit 120B) of the configuration of a power amplification circuit 120 using MOSFETs. Note that the same elements as those in the power amplification circuit 120A illustrated in FIG. 6 are given the same reference numerals to omit the description thereof.

As illustrated in FIG. 8, the power amplification circuit 120B includes N-channel MOSFETs 800 to 803 instead of the NPN transistors 604 to 607 in FIG. 6. The power amplification circuit 120B also includes an N-channel MOSFET 804 and an operational amplifier 805 instead of the NPN transistors 608, 609 illustrated in FIG. 6.

The N-channel MOSFETs 800, 801 constitute a differential amplification circuit. The power-supply voltage $V_{CC}$ is supplied to the drains (input electrodes) of the N-channel MOSFETs 800, 801 through the input-side winding wire 622 of the transformer 601. The sources (output electrodes) of the N-channel MOSFETs 800, 801 are grounded. Then, the gate (control electrode) of the N-channel MOSFET 800 is connected to one end of the output-side winding wire 621 of the transformer 600, and the base of the N-channel MOSFET 801 is connected to the other end of the output-side winding wire 621 of the transformer 600. Since RF signals input to the gates of the N-channel MOSFETs 800, 801 are opposite in phase to each other, the outputs of the drains of the N-channel MOSFETs 800, 801 are amplified signals of the RF signals.

The N-channel MOSFETs 802, 803 are cross-coupled to the N-channel MOSFETs 800, 801. Specifically, the drain of the N-channel MOSFET 802 is connected to the drain of the N-channel MOSFET 800, and the source thereof is grounded through the resistor 612. Then, the gate of the N-channel MOSFET 802 is connected to the gate of the N-channel MOSFET 801. Further, the drain of the N-channel MOSFET 803 is connected to the drain of the N-channel MOSFET 801, and the source thereof is grounded through the resistor 613. Then, the gate of the N-channel MOSFET 803 is connected to the gate of the N-channel MOSFET 800.

The constant current circuit 617, the N-channel MOSFET 804, and the operational amplifier 805 constitute a bias circuit using battery voltage $V_{BAT}$ to supply bias voltage to the differential amplification circuit made up of the N-channel MOSFETs 800, 801.

Thus, even in the power amplification circuit 120B using the MOSFETs, there is no need to provide a decoupling capacitor on the supply line of the power-supply voltage $V_{CC}$. Therefore, even when the power-supply voltage $V_{CC}$ controlled by envelope tracking is supplied to multiple power amplification circuits 120B, the control of the power-supply voltage $V_{CC}$ can be suppressed from becoming sluggish. This can improve the accuracy of envelope tracking control, and hence the power efficiency of the power amplification module 113.

Further, the N-channel MOSFETs 802, 803 are cross-coupled to the N-channel MOSFETs 800, 801 that constitute the differential amplification circuit. Therefore, the gate-drain capacitance of the N-channel MOSFET 800 is canceled out by the gate-drain capacitance of the N-channel MOSFET 802. Similarly, the gate-drain capacitance of the N-channel MOSFET 801 is canceled out by the gate-drain capacitance of the N-channel MOSFET 803. This can suppress a gain variation in the power amplification circuit 120B.

Since the power supply circuit 112 is often configured using MOSFETs, use of MOSFETs in the power amplification module 113 can unify the power supply circuit 112 and the power amplification module 113, resulting in downsizing of the transmitting module.

Although dummy transistors (N-channel MOSFETs 802, 803) are provided to cancel out the gate-drain capacitances in the configuration illustrated in FIG. 8, the configuration may also be a configuration without such dummy transistors.

Figure 9:
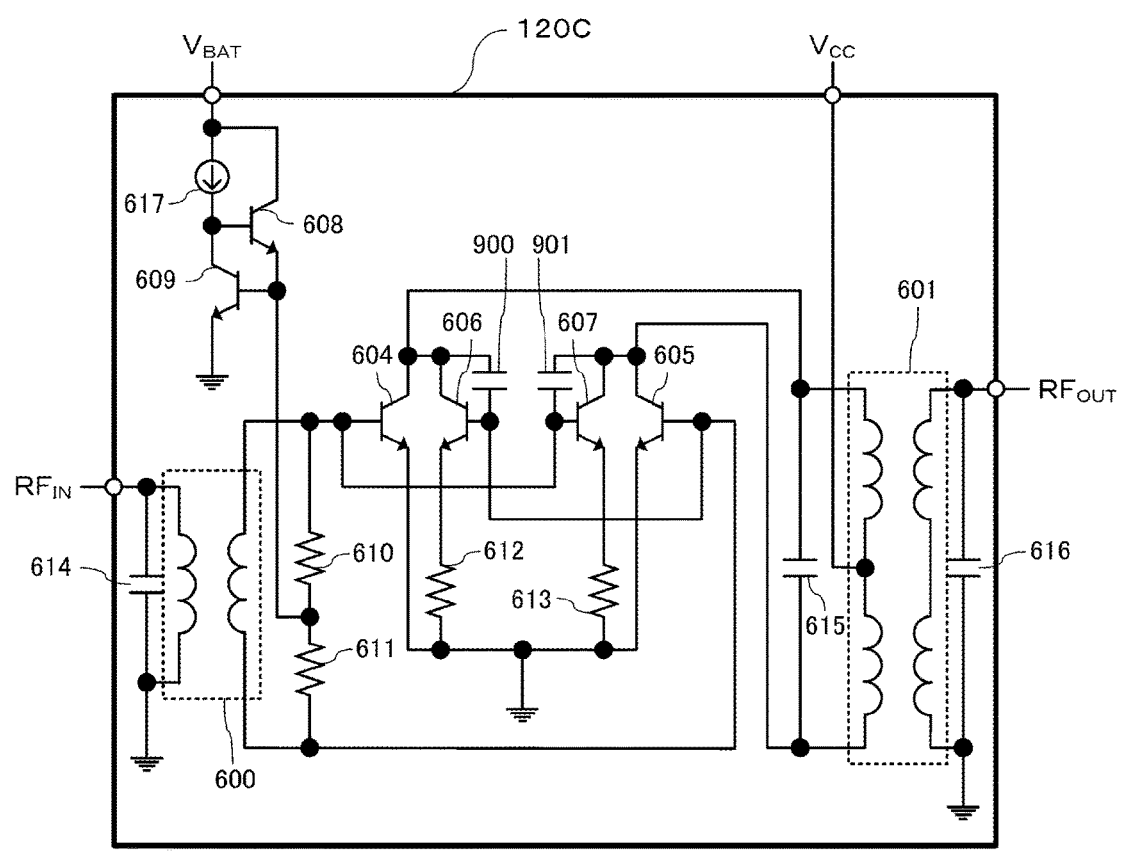
FIG. 9 is a diagram illustrating an example of a configuration where capacitors are added to suppress gain variations in a power amplification circuit.

FIG. 9 is a diagram illustrating an example (power amplification circuit 120C) of the configuration of a power amplification circuit 120 where capacitors are added to suppress a gain variation in the power amplification circuit 120. Note that the same elements as those in the power amplification circuit 120A illustrated in FIG. 6 are given the same reference numerals to omit the description thereof.

As illustrated in FIG. 9, the power amplification circuit 120C includes a capacitor 900 (first capacitor) and a capacitor 901 (second capacitor) in addition to the configuration illustrated in FIG. 6. The capacitors 900, 901 are, for example, of an MIM (Metal-Insulator-Metal) structure having a capacitance value smaller than those of the base-collector capacitances of the NPN transistors 604, 605. The capacitor 900 is connected between the base (control electrode) and the collector (input electrode) of the NPN transistor 606, and the capacitor 901 is connected between the base (control electrode) and the collector (input electrode) of the NPN transistor 607.

Thus, the capacitors 900, 901 are so provided that part of the base-collector capacitances of the NPN transistors 604, 605, which is unable to be canceled out by the dummy transistors (NPN transistors 606, 607), can be compensated for by the capacitors 900, 901. This can suppress a gain variation in the power amplification circuit 120C.

Figure 10:
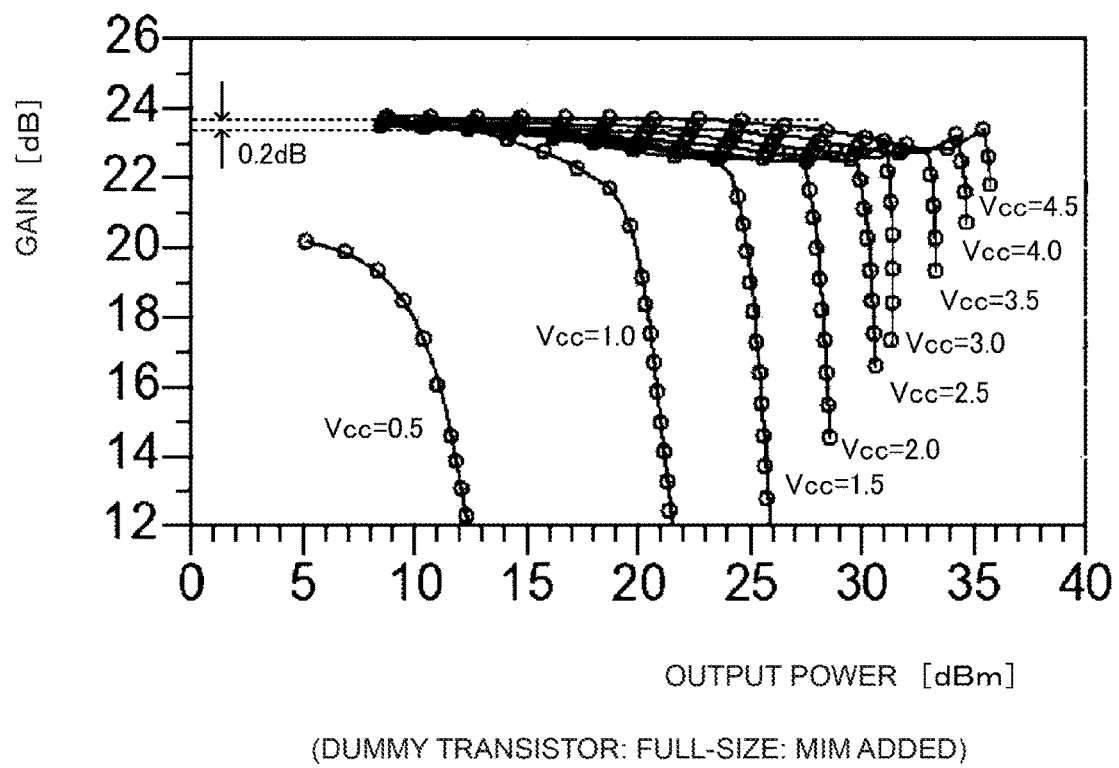
FIG. 10 is a graph illustrating simulation results where the suppressive effect of adding capacitors on gain variations was confirmed.

FIG. 10 is a graph illustrating simulation results where the suppressive effect of adding the capacitors 900, 901 on gain variations was confirmed. Note that the capacitance values of the capacitors 900, 901 are set in simulation to ¼ of the base-collector capacitances of the NPN transistors 604, 605. The other simulation conditions are the same as those of the case illustrated in FIG. 7D.

As illustrated in the graph of FIG. 10, when the capacitors 900, 901 are added, the gain difference in the range of the power-supply voltage $V_{CC}$ from 1.0 V to 3.5 V is about 0.2 dB. In other words, the gain difference is smaller than that when there are no capacitors 900, 901 (FIG. 7D). Thus, the capacitors 900, 901 are provided between the base and collector of each of the dummy transistors (NPN transistors 606, 607) so that a gain variation in the power amplification circuit 120C can be suppressed.

Figure 11:
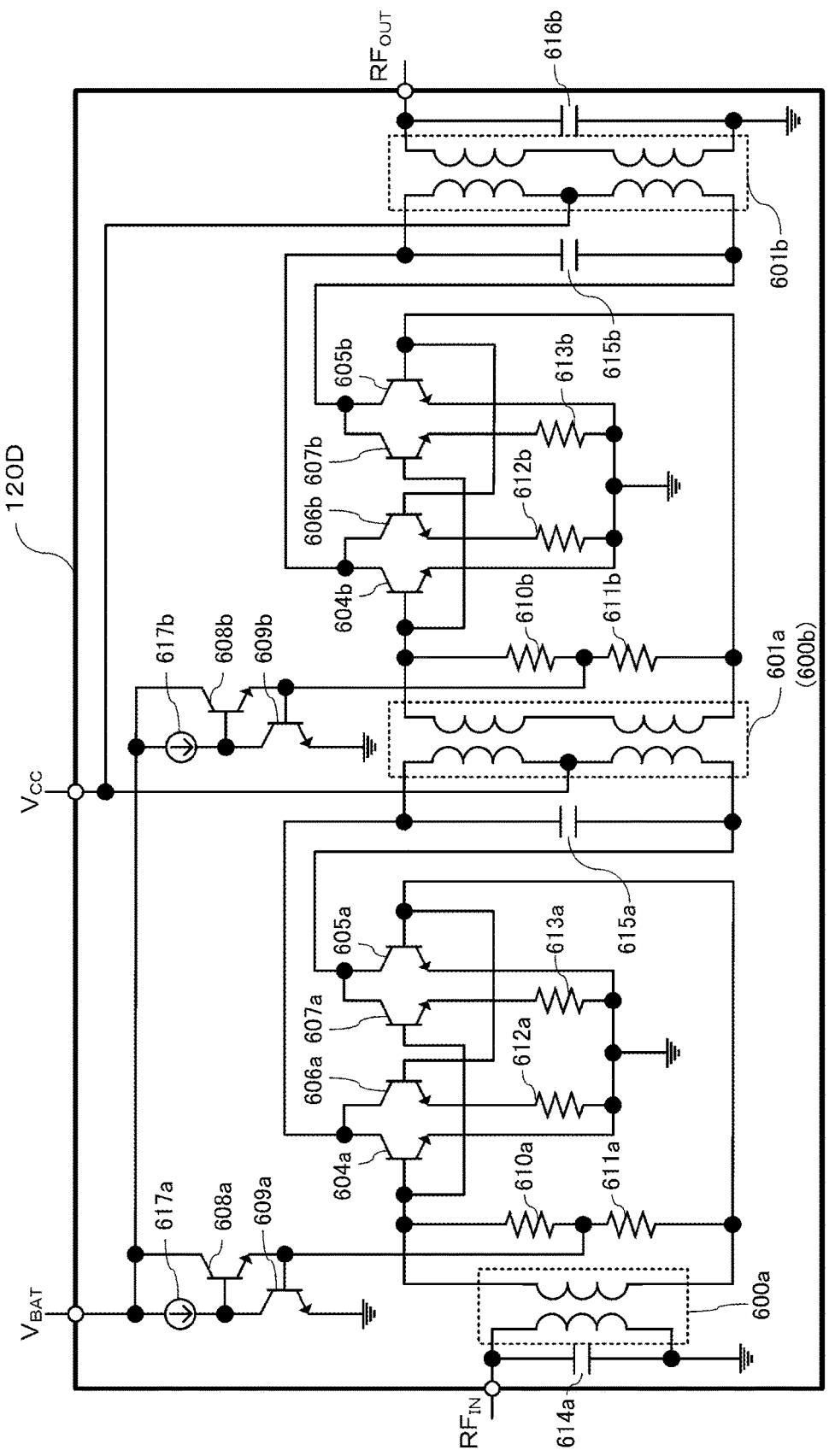
FIG. 11 is a diagram illustrating an example of the configuration of a two-stage power amplification circuit.

FIG. 11 is a diagram illustrating an example (power amplification circuit 120D) of the configuration of a two-stage power amplification circuit 120. In FIG. 11, elements with "a" suffixed to respective numerals constitute a first-stage amplification circuit, and elements with "b" suffixed to respective numerals constitute a second-stage amplification circuit. Note that elements in each stage are given reference numerals identical to the elements in the power amplification circuit 120A illustrated in FIG. 6 except for the suffixes "a" and "b."

In the power amplification circuit 120D, a first-stage differential amplification circuit (first differential amplification circuit) is made up of an NPN transistor 604a (first transistor) and an NPN transistor 605a (second transistor). Then, an amplified signal (first amplified signal), obtained by amplifying a difference between RF signals (first and second radio frequency signals) input to the bases of the NPN transistors 604a, 605a through a transformer 600a (first transformer), is input to a transformer 601a (second transformer). Like in the power amplification circuit 120A illustrated in FIG. 6, an NPN transistor 606a (third transistor) and an NPN transistor 607a (fourth transistor) are cross-coupled to the NPN transistor 604a and the NPN transistor 605a.

Further, a second-stage differential amplification circuit (third differential amplification circuit) is made up of an NPN transistor 604b (ninth transistor) and an NPN transistor 605b (tenth transistor). Then, an amplified signal (third amplified signal) obtained by amplifying a difference between RF signals (fifth and sixth radio frequency signals) input to the bases of the NPN transistors 604b, 605b through the transformer 601a (second transformer) is input to a transformer 601b (fifth transformer). Further, an NPN transistor 606b (eleventh transistor) and an NPN transistor 607b (twelfth transistor) are cross-coupled to the NPN transistor 604b and the NPN transistor 605b.

Thus, even when each power amplification circuit 120 is configured in two or more stages, there is no need to provide a decoupling capacitor on the supply line of the power-supply voltage $V_{CC}$. Therefore, even when the power-supply voltage $V_{CC}$ controlled by envelope tracking is supplied to multiple power amplification circuits 120, the control of the power-supply voltage $V_{CC}$ can be suppressed from becoming sluggish. This can improve the accuracy of envelope tracking control, and hence the power efficiency of the power amplification module 113.

Note that the number of stages in the power amplification circuit 120 is not limited to two stages, and it may be three stages or more. Further, when the power amplification circuit 120 is configured using MOSFETs, it can be configured in two or more stages in the same manner. Even when the power amplification circuit 120 is configured in two or more stages, a capacitor can be provided between the control electrode and the input electrode of a dummy transistor as illustrated in FIG. 9.

Figure 12:
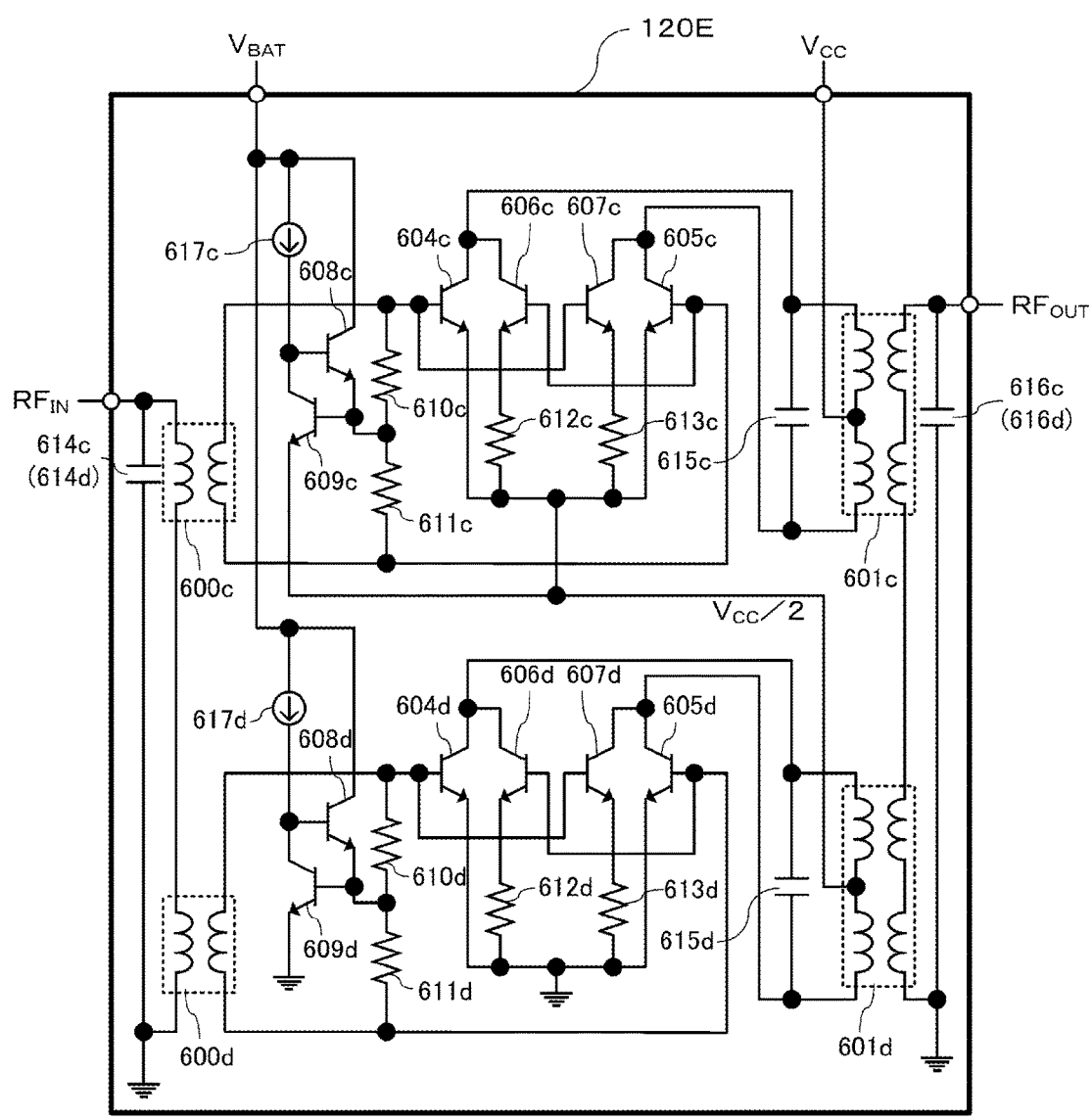
FIG. 12 is a diagram illustrating an example of the configuration of a power amplification circuit in a vertical stack.

FIG. 12 is a diagram illustrating an example (power amplification circuit 120E) of the configuration of a power amplification circuit 120 in a cascade connection. In FIG. 12, elements with "c" suffixed to respective numerals constitute an upper-stage amplification circuit, and elements with "d" suffixed to respective numerals constitute a lower amplification circuit. Note that elements in each stage are given reference numerals identical to the elements in the power amplification circuit 120A illustrated in FIG. 6 except for the suffixes "c" and "d."

In the power amplification circuit 120E, an upper-stage differential amplification circuit (first differential amplification circuit) is made up of an NPN transistor 604c (first transistor) and an NPN transistor 605c (second transistor). Then, an amplified signal (first amplified signal) obtained by amplifying a difference between RF signals (first and second radio frequency signals) input to the bases of the NPN transistors 604c, 605c through a transformer 600c (first transformer) is input to a transformer 601c (second transformer). Like in the power amplification circuit 120A illustrated in FIG. 6, an NPN transistor 606c (third transistor) and an NPN transistor 607c (fourth transistor) are cross-coupled to the NPN transistor 604c and the NPN transistor 605c.

Further, a lower-stage differential amplification circuit (second differential amplification circuit) is made up of an NPN transistor 604d (fifth transistor) and an NPN transistor 605d (sixth transistor). Then, an amplified signal (second amplified signal) obtained by amplifying a difference between RF signals (third and fourth radio frequency signals) input to the bases of the NPN transistors 604d, 605d through a transformer 600d (third transformer) is input to a transformer 601d (fourth transformer). Further, an NPN transistor 606d (seventh transistor) and an NPN transistor 607d (eighth transistor) are cross-coupled to the NPN transistor 604d and the NPN transistor 605d.

As illustrated in FIG. 12, the power-supply voltage $V_{CC}$ is applied to a midpoint of the input-side winding wire of the upper-stage transformer 601c. Further, the midpoint of the input-side winding wire of the lower-stage transformer 601d is connected to the emitters of the upper-stage NPN transistors 604c, 605c. Then, the emitters of the lower-stage NPN transistors 604d, 605d are grounded. In such a configuration, the amplification circuit in each stage operates with a voltage of Vcc/2. Therefore, the power amplification circuit 120 can be configured using elements having a low breakdown voltage compared with the configuration in FIG. 6.

Embodiment of the disclosure have been described above. According to the power amplification module 113 of the embodiments described above, the power-supply voltage $V_{CC}$ can be supplied through a transformer to transistors that constitute a differential amplification circuit in each power amplification circuit 120. Therefore, there can be no need to provide a decoupling capacitor on the supply line of each power amplification circuit 120. This can suppress the control of the power-supply voltage $V_{CC}$ by envelope tracking from becoming sluggish. Thus, the accuracy of envelope tracking control can be improved, and hence the power efficiency of the power amplification module 113 can be improved.

Further, according to the power amplification module 113 of the embodiments described above, dummy transistors can be cross-coupled to transistors that constitute a differential amplification circuit in each power amplification circuit 120. This can suppress a gain variation due to the voltage dependency of parasitic capacitance between the control electrode and input electrode of each of transistors that constitute the differential amplification circuit.

Further, according to the power amplification module 113 of the embodiments described above, the size of dummy transistors can be set identical to transistors that constitute a differential amplification circuit in each power amplification circuit 120 so that the suppressive effect on a gain variation can be enhanced.

Further, according to the power amplification module 113 of the embodiments described above, a capacitor can be provided between the control electrode and input electrode of a dummy transistor in each power amplification circuit 120, for example, as illustrated in FIG. 9 so that the suppressive effect on a gain variation can be enhanced.

Then, according to the power amplification module 113 of the embodiments described above, the capacitance value of the capacitor between the control electrode and input electrode of the dummy transistor can be set smaller than the capacitance value of parasitic capacitance between the control electrode and input electrode of each of the transistors that constitute the differential amplification circuit so that the suppressive effect on a gain variation can be enhanced.

Further, according to the power amplification module 113 of the embodiments described above, the multiple power amplification circuits 120 can be star-connected to the power supply circuit 112. This shortens the wiring distance from the power supply circuit 112 to each power amplification circuit 120 so that the control of the power-supply voltage $V_{CC}$ by envelope tracking can be suppressed from becoming sluggish by wiring parasitic capacitance.

Note that the embodiment is to make it easy to understand the present disclosure, and should not be interpreted to limit the present disclosure. The present disclosure can be modified and improved without departing from the spirit of the disclosure, and equivalents thereof are included in the present disclosure.

DESCRIPTION OF REFERENCE NUMERALS 100 transmitting unit
110 baseband unit
111 RF unit
112 power supply circuit
113 power amplification module
114 front end unit
115 antenna
120 power amplification circuit
300, 301 delay circuit
302 RF modulation section
303 amplitude level detecting section
304 distortion compensation section
305 DAC
600, 601 transformer
604 to 609 NPN transistor
610 to 613 resistor
614 to 616, 900, 901 capacitor
617 constant current circuit
800 to 804 N-channel MOSFET
805 operational amplifier

The invention claimed is:

1. A power amplification module including a plurality of power amplification circuits, each of the power amplification circuits comprising:
   a first transformer including a first input-side winding wire to which a radio frequency signal is input, and a first output-side winding wire electromagnetically coupled to the first input-side winding wire;
   a first differential amplification circuit including a first transistor, in which a first radio frequency signal output from a first end of the first output-side winding wire is input to a control electrode of the first transistor, and a second transistor, in which a second radio frequency signal output from a second end of the first output-side winding wire is input to a control electrode of the second transistor, the first differential amplification circuit outputting a first amplified signal obtained by amplifying a difference between the first and second radio frequency signals;
   a second transformer including a second input-side winding wire, to which the first amplified signal is input, for supplying a power-supply voltage that varies according to an amplitude of the radio frequency signal to the first differential amplification circuit, and a second output-side winding wire electromagnetically coupled to the second input-side winding wire;
   a third transistor connected in parallel with the first transistor and in which the second radio frequency signal is input to a control electrode of the third transistor; and
   a fourth transistor connected in parallel with the second transistor and in which the first radio frequency signal is input to a control electrode of the fourth transistor.

2. The power amplification module according to claim 1, wherein a size of the third transistor is the same as a size of the first transistor, and a size of the fourth transistor is the same as a size of the second transistor.

3. The power amplification module according to claim 1, further comprising:
   a first capacitor connected between the control electrode of the third transistor and an input electrode of the third transistor; and
   a second capacitor connected between the control electrode of the fourth transistor and an input electrode of the fourth transistor.

4. The power amplification module according to claim 3, wherein
   the first capacitor has a capacitance value smaller than a parasitic capacitance between the control electrode and the input electrode of the third transistor, and
   the second capacitor has a capacitance value smaller than a parasitic capacitance between the control electrode and the input electrode of the fourth transistor.

5. The power amplification module according to claim 1, wherein the first, second, third, and fourth transistors are heterojunction bipolar transistors.

6. The power amplification module according to claim 1, wherein the first, second, third, and fourth transistors are MOSFETs.

7. A power amplification module including a plurality of power amplification circuits, each of the power amplification circuits comprising:
- a first transformer including a first input-side winding wire to which a radio frequency signal is input, and a first output-side winding wire electromagnetically coupled to the first input-side winding wire;
- a first differential amplification circuit including a first transistor, in which a first radio frequency signal output from a first end of the first output-side winding wire is input to a control electrode of the first transistor, and a second transistor, in which a second radio frequency signal output from a second end of the first output-side winding wire is input to a control electrode of the second transistor, the first differential amplification circuit outputting a first amplified signal obtained by amplifying a difference between the first and second radio frequency signals;
- a second transformer including a second input-side winding wire, to which the first amplified signal is input, for supplying a power-supply voltage that varies according to an amplitude of the radio frequency signal to the first differential amplification circuit, and a second output-side winding wire electromagnetically coupled to the second input-side winding wire;
- a third transformer to which the radio frequency signal is input, including a third input-side winding wire connected to a grounded side of the first input-side winding wire and, and a third output-side winding wire electromagnetically coupled to the third input-side winding wire;
- a second differential amplification circuit including a fifth transistor, in which a third radio frequency signal output from a first end of the third output-side winding wire is input to a control electrode of the fifth transistor, and a sixth transistor, in which a fourth radio frequency signal output from a second end of the third output-side winding wire is input to a control electrode of the sixth transistor, the second differential amplification circuit outputting a second amplified signal obtained by amplifying a difference between the third and fourth radio frequency signals; and
- a fourth transformer, to which the second amplified signal is input, including a fourth input-side winding wire connected to a grounded side of the first differential amplification circuit and a fourth output-side winding wire connected to a grounded side of the second output-side winding wire and electromagnetically coupled to the fourth input-side winding wire.

8. The power amplification module according to claim 7, further comprising:
- a seventh transistor, to which the fourth radio frequency signal is input, connected in parallel with the fifth transistor and; and
- an eighth transistor, to which the third radio frequency signal is input, connected in parallel with the sixth transistor.

9. The power amplification module according to claim 7, wherein a size of the seventh transistor is the same as a size of the fifth transistor, and a size of the eighth transistor is the same as a size of the sixth transistor.

10. The power amplification module according to claim 7, further comprising:
- a third capacitor connected between a control electrode of the seventh transistor and an input electrode of the seventh transistor; and
- a fourth capacitor connected between a control electrode of the eighth transistor and an input electrode of the eighth transistor.

11. The power amplification module according to claim 10, wherein
the third capacitor has a capacitance value smaller than a parasitic capacitance between the control electrode and the input electrode of the seventh transistor, and
the fourth capacitor has a capacitance value smaller than a parasitic capacitance between the control electrode and the input electrode of the eighth transistor.

12. A power amplification module including a plurality of power amplification circuits, each of the power amplification circuits comprising:
- a first transformer including a first input-side winding wire to which a radio frequency signal is input, and a first output-side winding wire electromagnetically coupled to the first input-side winding wire;
- a first differential amplification circuit including a first transistor, in which a first radio frequency signal output from a first end of the first output-side winding wire is input to a control electrode of the first transistor, and a second transistor, in which a second radio frequency signal output from a second end of the first output-side winding wire is input to a control electrode of the second transistor, the first differential amplification circuit outputting a first amplified signal obtained by amplifying a difference between the first and second radio frequency signals;
- a second transformer including a second input-side winding wire, to which the first amplified signal is input, for supplying a power-supply voltage that varies according to an amplitude of the radio frequency signal to the first differential amplification circuit, and a second output-side winding wire electromagnetically coupled to the second input-side winding wire;
- a third differential amplification circuit including a ninth transistor, in which a fifth radio frequency signal output from a first end of the second output-side winding wire is input to a control electrode of the ninth transistor, and a tenth transistor, in which a sixth radio frequency signal output from a second end of the second output-side winding wire is input to a control electrode of the sixth transistor, the third differential amplification circuit outputting a third amplified signal obtained by amplifying a difference between the fifth and sixth radio frequency signals; and
- a fifth transformer, to which the third amplified signal is input, including a fifth input-side winding wire for supplying the power-supply voltage that varies according to the amplitude of the radio frequency signal to the third differential amplification circuit, and a fifth output-side winding wire electromagnetically coupled to the fifth input-side winding wire.

13. The power amplification module according to claim 12, further comprising:
- an eleventh transistor, to which the sixth radio frequency signal is input, connected in parallel with the ninth transistor; and
- a twelfth transistor, to which the fifth radio frequency signal is input, connected in parallel with the tenth transistor.

14. The power amplification module according to claim 7, wherein a size of the eleventh transistor is the same as a size of the ninth transistor, and a size of the twelfth transistor is the same as a size of the tenth transistor.

15. The power amplification module according to claim 7, further comprising:
   a fifth capacitor connected between a control electrode of the eleventh transistor and an input electrode of the eleventh transistor; and
   a sixth capacitor connected between a control electrode of the twelfth transistor and an input electrode of the twelfth transistor.

16. The power amplification module according to claim 10, wherein
   the fifth capacitor has a capacitance value smaller than a parasitic capacitance between the control electrode and the input electrode of the eleventh transistor, and
   the sixth capacitor has a capacitance value smaller than a parasitic capacitance between the control electrode and the input electrode of the twelfth transistor.

17. The power amplification module according to claim 1, wherein each power amplification circuit further comprises:
   a third transformer to which the radio frequency signal is input, including a third input-side winding wire connected to a grounded side of the first input-side winding wire and, and a third output-side winding wire electromagnetically coupled to the third input-side winding wire;
   a second differential amplification circuit including a fifth transistor, in which a third radio frequency signal output from a first end of the third output-side winding wire is input to a control electrode of the fifth transistor, and a sixth transistor, in which a fourth radio frequency signal output from a second end of the third output-side winding wire is input to a control electrode of the sixth transistor, the second differential amplification circuit outputting a second amplified signal obtained by amplifying a difference between the third and fourth radio frequency signals; and
   a fourth transformer, to which the second amplified signal is input, including a fourth input-side winding wire connected to a grounded side of the first differential amplification circuit and a fourth output-side winding wire connected to a grounded side of the second output-side winding wire and electromagnetically coupled to the fourth input-side winding wire.

* * * * *